United States Patent
Choi

(10) Patent No.: US 12,197,741 B2
(45) Date of Patent: Jan. 14, 2025

(54) MEMORY, OPERATION METHOD OF MEMORY, AND OPERATION METHOD OF MEMORY SYSTEM

(71) Applicant: SK hynix Inc., Gyeonggi-do (KR)

(72) Inventor: Joon Yong Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/519,302

(22) Filed: Nov. 4, 2021

(65) Prior Publication Data

US 2022/0413713 A1 Dec. 29, 2022

(30) Foreign Application Priority Data

Jun. 24, 2021 (KR) .................. 10-2021-0082245

(51) Int. Cl.
*G06F 3/06* (2006.01)

(52) U.S. Cl.
CPC .......... *G06F 3/0619* (2013.01); *G06F 3/0655* (2013.01); *G06F 3/0673* (2013.01)

(58) Field of Classification Search
CPC ........ G06F 12/00; G06F 13/00; G06F 3/0655; G06F 3/0604; G06F 3/0679
See application file for complete search history.

(56) References Cited

U.S. PATENT DOCUMENTS

| | | | |
|---|---|---|---|
| 8,443,262 B2 | 5/2013 | Foley | |
| 2003/0172328 A1* | 9/2003 | Wyatt | G06F 11/0727 714/704 |
| 2004/0250177 A1* | 12/2004 | Bychkov | G06F 11/1068 714/E11.038 |
| 2005/0047226 A1* | 3/2005 | Martinelli | G11C 29/83 365/200 |
| 2006/0227630 A1* | 10/2006 | Kato | G11C 29/50004 365/189.09 |
| 2006/0239111 A1* | 10/2006 | Shingo | G11C 16/16 365/230.09 |
| 2011/0157439 A1* | 6/2011 | Sawada | H03M 1/164 348/300 |
| 2014/0330533 A1* | 11/2014 | Gadlage | G01R 31/302 702/120 |
| 2020/0089564 A1 | 3/2020 | Chao et al. | |
| 2022/0050745 A1* | 2/2022 | Eno | G06F 11/1068 |

* cited by examiner

*Primary Examiner* — Tuan V Thai
(74) *Attorney, Agent, or Firm* — IP & T GROUP LLP

(57) ABSTRACT

A method for operating a memory includes: performing an error check operation; detecting N bad sections during the error check operation, where N is an integer equal to or greater than 1; stopping the error check operation in response to the detecting of the N bad sections; transferring information on the N bad sections to a memory controller; and resuming the error check operation in response to the transferring of the information on the N bad sections to a memory controller.

15 Claims, 3 Drawing Sheets

MEMORY, OPERATION METHOD OF MEMORY, AND OPERATION METHOD OF MEMORY SYSTEM

CROSS-REFERENCE TO RELATED APPLICATIONS

The present application claims priority to Korean Patent Application No. 10-2021-0082245, filed on Jun. 24, 2021, which is incorporated herein by reference in its entirety.

BACKGROUND

1. Field

Various embodiments of the present invention relate to a memory and a memory system.

2. Description of the Related Art

In the early stage of the semiconductor memory industry, there were many originally good dies on the wafers, which means that memory chips were produced with no defective memory cells through a semiconductor fabrication process. However, as the capacity of memory devices increased, it became difficult to fabricate a memory device that does not have any defective memory cells, and nowadays, it may be said that there are substantially no chances that a memory device is fabricated without any defective memory cells. To address the problem, a repair method of including redundancy memory cells in a memory device and replacing defective memory cells with the redundancy memory cells has been used.

Another solution to such an issue is using an Error Correction Circuit (ECC) for correcting errors in a memory system and correcting an error that occurs in a memory cell and an error that occurs as data are transferred during a read and write process of a memory system.

SUMMARY

Embodiments of the present invention are directed to an error checking technology in a memory and a memory system.

In accordance with an embodiment of the present invention, a method for operating a memory includes: performing an error check operation; detecting N bad sections during the error check operation, where N is an integer equal to or greater than 1; stopping the error check operation in response to the detecting of the N bad sections; transferring information on the N bad sections to a memory controller; and resuming the error check operation in response to the transferring of the information on the N bad sections to a memory controller.

In accordance with another embodiment of the present invention, a method for operating a memory system includes: performing, by a memory, an error check operation in a memory; detecting, by the memory, N bad sections during the error check operation in the memory, where N is an integer equal to or greater than 1; stopping, by the memory, the error check operation in response to the detecting of the N bad sections in the memory; requesting, by a memory controller, the memory for bad section information; transferring, by the memory, information on the N bad sections to the memory controller; and resuming, by the memory, the error check operation in response to the transferring of the information on the N bad sections.

In accordance with yet another embodiment of the present invention, a memory includes: a memory core including a plurality of memory cells; an error correction circuit suitable for correcting an error of data read from the memory core based on an error correction code read from the memory core; an error check operation control circuit suitable for checking an error in data stored in the memory core by using the error correction circuit during an error check operation; a bad section detecting circuit suitable for detecting a bad section based on the checked error; and a bad section storing circuit suitable for storing an address of the bad section detected by the bad section detecting circuit, wherein the error check operation control circuit is further suitable for stopping the error checking operation when a number of bad section addresses stored in the bad section storing circuit during the error checking operation is N, where N is an integer equal to or greater than 1.

In accordance with still yet another embodiment of the present invention, a memory includes: a memory core including sections; and a control circuit configured to: perform an error detecting operation on the sections to detect one or more bad sections among the sections, suspend the error detecting operation upon detecting a predetermined number of the bad sections, and resume the suspended error detecting operation upon providing an external device with information of the detected bad sections, wherein at least a predetermined number of errors are detected, through the error detecting operation, from data stored in the bad section.

DETAILED DESCRIPTION

Figure 1:
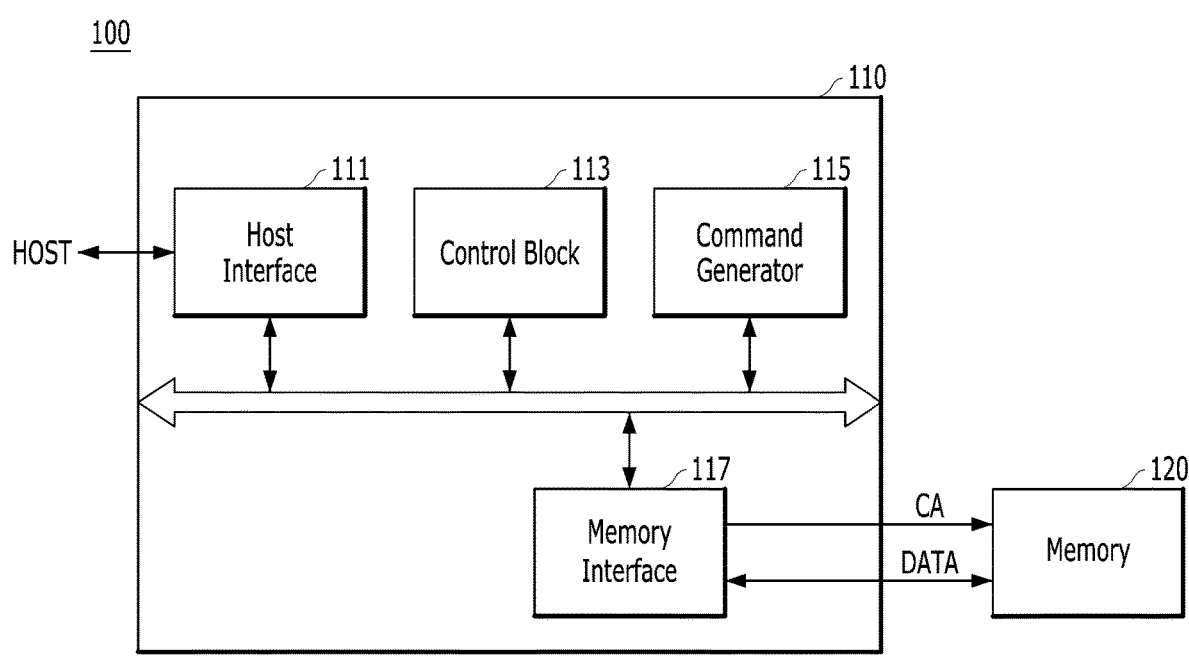
FIG. 1 is a block diagram illustrating a memory system 100 in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory system 100 in accordance with an embodiment of the present invention.

The memory controller 110 may control the operation of the memory 120 according to a request of a host HOST. The host HOST may include a Central Processing Unit (CPU), a Graphic Processing Unit (GPU), an Application Processor (AP), and the like. The memory controller 110 may include a host interface 111, a control block 113, a command generator 115, and a memory interface 117. The memory controller 110 may be included in a CPU, GPU, AP, etc. In this case, the host HOST may mean the structure other than the memory controller 110 in these structures. For example, when the memory controller 110 is included in the CPU, the host HOST of the drawing may represent the other components except for the memory controller 110 in the CPU.

The host interface 111 may be an interface for communication between the host HOST and the memory controller 110.

The control block 113 may control the overall operations of the memory controller 110 and schedule the operations to be commanded to the memory 220. The control block 113 may change the sequential order in which the requests are received from the host HOST and the order of the operations to be commanded to the memory 120 to improve the performance of the memory 120. For example, even though the host HOST requests for a read operation of the memory 120 first and then requests for a write operation, the sequential order may be adjusted so that the write operation is performed before the read operation.

The command generator 115 may generate a command to be applied to the memory 120 according to the sequential order of the operations determined by the control block 113.

The memory interface 117 may be used as an interface between the memory controller 110 and the memory 120. A command and an address CA may be transferred from the memory controller 110 to the memory 120 through the memory interface 117, and data DATA may be transferred/received. The memory interface 117 may also be referred to as a PHY interface.

The memory controller 110 may control the memory 120 in an error check operation mode. When the control block 113 determines to operate the memory 120 in an error check operation mode, the command generator 115 may generate a command for controlling the memory 120 in an error check operation mode, and the memory interface 117 may transfer the command generated by the command generator 115 to the memory 120. The memory controller 110 may request the memory 120 for bad section information collected during the error check operation of the memory 120 and receive the bad section information from the memory 120.

The memory 120 may perform an operation commanded by the memory controller 110. The memory 120 will be described in detail below with reference to FIG. 2.

Figure 2:
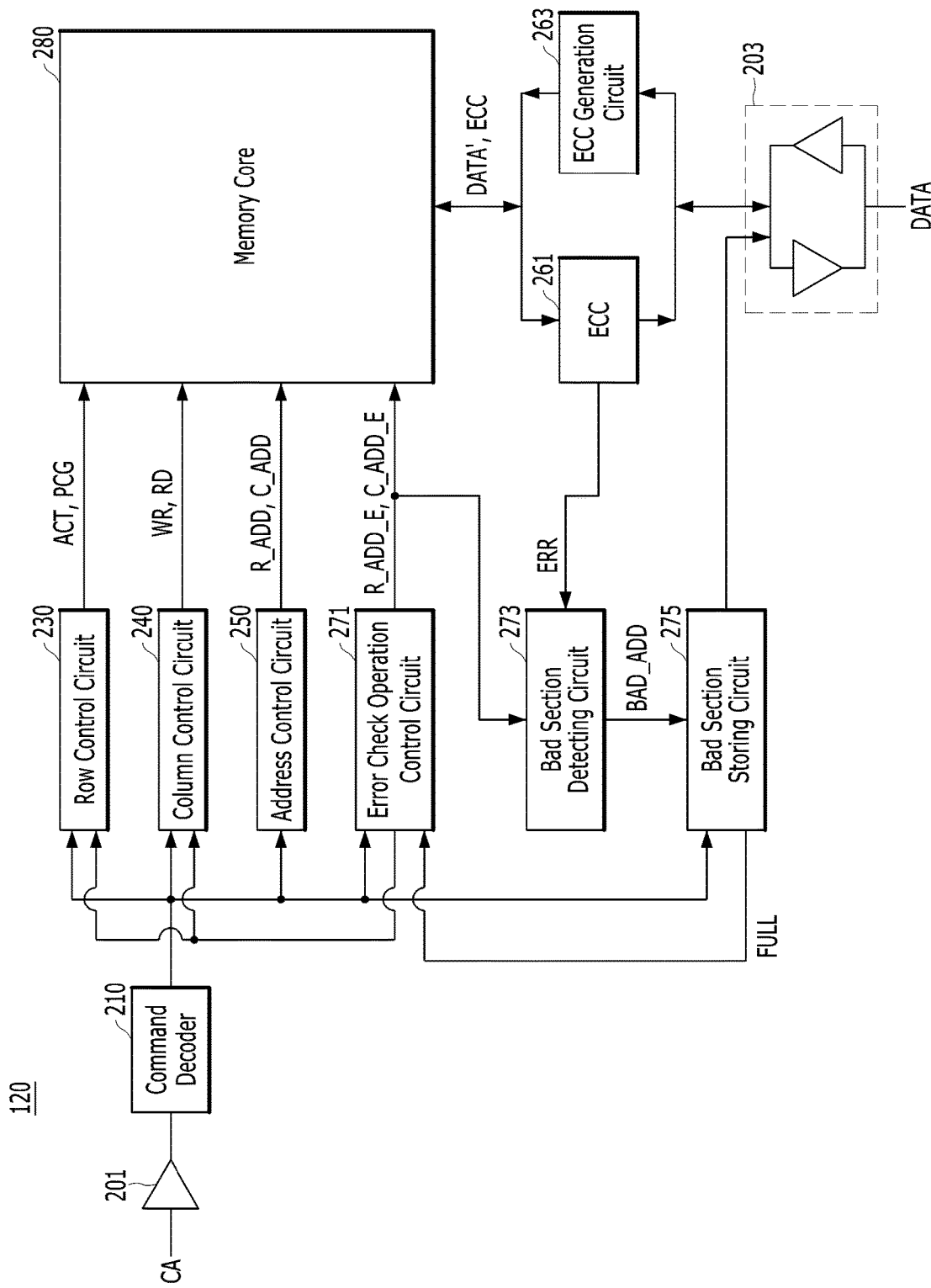
FIG. 2 is a block diagram illustrating the memory 120 shown in FIG. 1 in accordance with an embodiment of the present invention.

FIG. 2 is a block diagram illustrating the memory 120 shown in FIG. 1 in accordance with an embodiment of the present invention.

Referring to FIG. 2, the memory 120 may include a command address receiving circuit 201, a data transferring and receiving circuit 203, a command decoder 210, a row control circuit 230, a column control circuit 240, an address control circuit 250, an error correction circuit 261, an error correction code generation circuit 263, an error check operation control circuit 271, a bad section detecting circuit 273, a bad section storing circuit 275, and a memory core 280.

The command address receiving circuit 201 may receive a command and an address CA. According to the type of memory 200, a command and an address may be input to the same input terminals, or a command and an address may be input to different input terminals. Herein, it is illustrated that the command and the address are input to the same input terminals. The command and the address CA may be multiple bits.

The data transferring and receiving circuit 203 may receive data DATA or transfer data DATA. The data transferring and receiving circuit 203 may receive data DATA to be written into the memory core 260 during a write operation, and transfer data DATA read from the memory core 260 during a read operation.

The command decoder 210 may decode the command and the address CA to find out the type of the operation commanded by the memory controller to the memory.

When a row-based operation such as an active operation or a precharge operation is commanded as a result of decoding of the command decoder 210, the row control circuit 230 may control these operations. An active signal ACT may be a signal directing an active operation, and a precharge signal PCG may be a signal directing a precharge operation.

When a column-based operation such as a write operation and a column operation is commanded as a result of decoding by the command decoder 210, the column control circuit 240 may control these operations. A write signal WR may be a signal directing a write operation, and a read signal RD may be a signal directing a read operation.

When an error check operation mode is commanded as a result of decoding of the command decoder 210, the memory 120 may operate in an error check operation mode. In the error check operation mode, the memory 120 may operate under the control of the error check operation control circuit 271.

The address control circuit 250 may determine an address received from the command decoder 210 as a row address R_ADD or a column address C_ADD and transfer it to the memory core 280. As a result of decoding of the command decoder 210, the address control circuit 250 may determine the received address as a row address R_ADD when an active operation is commanded, and determine the received address as a column address C_ADD when a read operation or a write operation is instructed.

The error correction circuit 261 may correct an error in data DATA' that is read from the memory core based on an error correction code ECC that is read from the memory core 280 during a read operation. Herein, correcting the error may mean detecting an error in the data DATA' and, when an error is detected, correcting the error in the data DATA'. The error correction circuit 261 may detect and correct an error in the error correction code ECC together with the data DATA'. When an error in the data DATA' is detected and corrected, the data DATA' that is input to the error correction circuit 261 and the data DATA that is output from the error correction circuit 261 may be different from each other. An error signal ERR may be a signal activated when an error is detected by the error correction circuit 261.

The error correction code generation circuit 263 may generate an error correction code ECC based on the data DATA during a write operation. During a write operation, the error correction code ECC may be generated based on the data DATA, but the error of the data DATA may not be corrected. Therefore, the data DATA that is input to the error correction code generation circuit 263 and the data DATA that is output from the error correction code generation circuit 263 may be the same.

The error check operation control circuit 271 may control an error check operation. The error check operation may also be referred to as an ECS (Error Check and Scrub) operation, and the error check operation may mean an operation of reading the data DATA' from the memory core 280 and checking the error of the data DATA' by using the error correction circuit 261 to detect an area with many errors. The error check operation control circuit 271 may control the error check operation when the error check operation mode is set. Since the rows and columns of the memory core 280 need to be controlled during the error check operation, the error check operation control circuit 271 may control the row control circuit 230 and the column control circuit 240 during the error check operation. The error check operation may be performed while changing the address. During the error check operation, a row address R_ADD_E and a column address C_ADD_E generated from the error check operation control circuit 271 may be used.

The bad section detecting circuit 273 may detect a bad section based on the error detected during an error check operation. For example, the bad section detecting circuit 273 may count the number of errors of each row and, when the number of errors of each row exceeds a threshold value, determine the row as a bad section. Since the bad section detecting circuit 273 receives the addresses R_ADD_E and C_ADD_E and the error signal ERR, it may detect which portion of the memory core 280 an error check operation is being performed on and whether an error is detected or not.

The bad section storing circuit 275 may store the address BAD_ADD of the bad section detected by the bad section detecting circuit 273. There may be a limit to the number of bad section addresses that may be stored in the bad section storing circuit 275. For example, the bad section storing circuit 275 may be capable of storing only one bad section address, or may be capable of storing three bad section addresses. When the bad section storing circuit 275 is full, a full signal FULL may be activated. While the full signal FULL is activated, the error check operation control circuit 271 may stop the error check operation.

The memory core 280 may perform an operation commanded by internal command signals ACT, PCG, WR, and RD. The memory core 280 may include components for active, precharge, read, and write operations, such as a cell array including memory cells that are arranged in a plurality of rows and a plurality of columns, a row decoder for activating/deactivating a row of the cell array, and a column decoder for inputting/outputting data from the cell array. When an active signal ACT is activated, a row selected based on the row address R_ADD among the rows of the memory core 280 may be activated. When a precharge signal PCG is activated, the activated row may be deactivated. When a write signal WR is activated, the data DATA' and the error correction code ECC may be written into the columns selected based on the column address C_ADD among the columns of the memory core 280. When a read signal RD is activated, the data DATA' and the error correction code ECC may be read from the columns selected based on the column address C_ADD among the columns of the memory core 280. During an error check operation, the addresses R_ADD_E and C_ADD_E generated by the error check operation control circuit 271 may be used instead of the addresses R_ADD and C_ADD of the address control circuit 250.

During an active operation of the memory 120, a row selected based on the row address R_ADD in the memory core 280 may be activated. That is, data of the selected row may be sensed. A read operation and a write operation of the memory 120 may be performed in an active state.

During a read operation of the memory 120, the data DATA' and the error correction code ECC may be read from the memory cells of the columns that are selected based on the column address C_ADD in the selected row of the memory core 280. The error correction circuit 261 may correct an error of the data DATA' based on the error correction code ECC, and the error-corrected data DATA may be transferred to the memory controller 110 through the data transferring and receiving circuit 203.

During a write operation of the memory 120, the data transferring and receiving circuit 203 may receive the data DATA transferred from the memory controller 110. The error correction code generation circuit 263 may generate the error correction code ECC based on the data DATA, and write the data DATA and the error correction code ECC into the memory cells of the columns that are selected based on the column address C_ADD in the selected row of the memory core 280.

Figure 3:
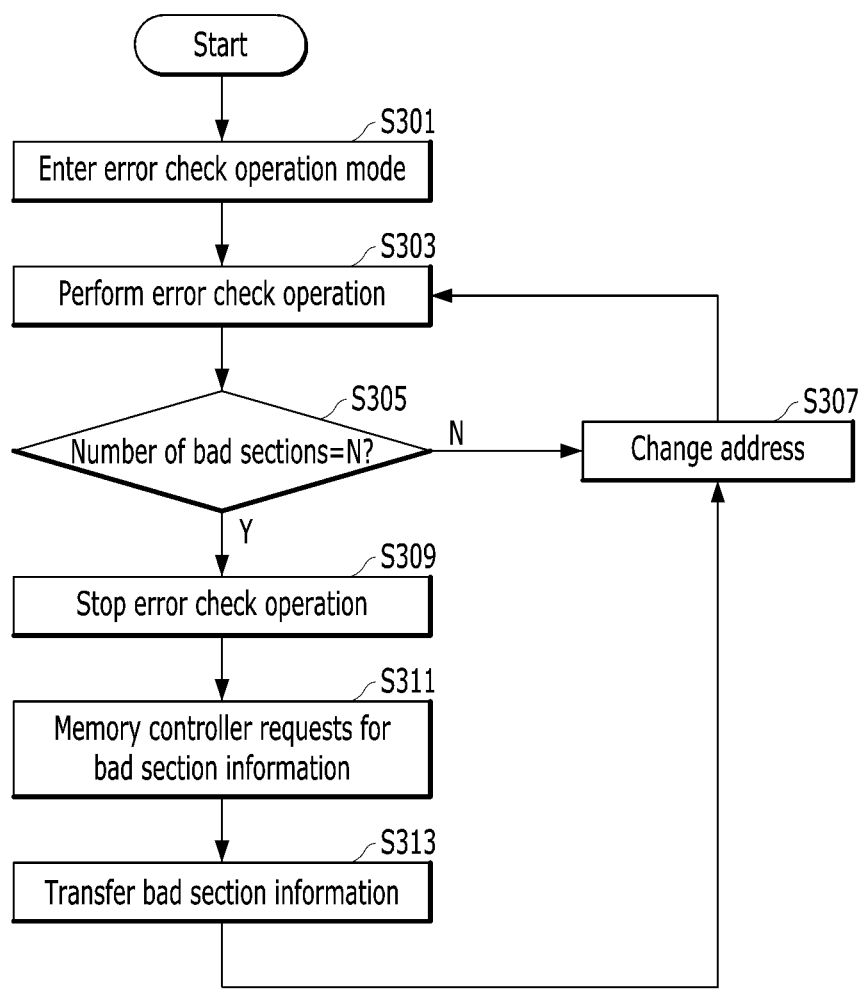
FIG. 3 is a flowchart describing an error check operation of the memory system 100 shown in FIG. 1 in accordance with an embodiment of the present invention.

FIG. 3 is a flowchart describing an error check operation of the memory system 100 shown in FIG. 1 in accordance with an embodiment of the present invention.

Referring to FIG. 3, first, the memory 120 may enter an error check operation mode in operation S301. When the memory controller 110 commands the memory 120 to enter an error check operation mode based on a command and an address CA, the memory 120 may enter the error check operation mode.

Now, the memory 120 may be able to perform an error check operation in operation S303. The error check operation may be performed by reading the data DATA' and the error correction code ECC from the memory core 280 based on the addresses R_ADD_E and C_ADD_E generated by the error check operation control circuit 271, and checking whether the data DATA' has an error or not based on the error correction circuit 261. Since the error check operation is an operation for checking an error in the data DATA', the data DATA that is read from the memory core 280 and error-corrected by the error correction circuit 261 may not be transferred to the memory controller 110. During the error check operation, the bad section detecting circuit 273 may detect a bad section based on the error detected during the error check operation. For example, the bad section detecting circuit 273 may count the number of errors for each row and, when the number of errors for each row is equal to or greater than a threshold value (e.g., 10), determine the row as a bad section. Also, the bad section storing circuit 275 may store the address BAD_ADD of the bad section determined by the bad section detecting circuit 273.

When the number of bad section addresses BAD_ADD stored in the bad section storing circuit 275 is not N (N in operation S305), that is, when the number of bad sections stored in the bad section storing circuit 275 is less than N, the error check operation control circuit 271 may change the address R_ADD_E and C_ADD_E in operation S307 and perform the error check operation again in the operation S303. Herein, N may represent a maximum storage capacity of the bad section storing circuit 275. For example, when the bad section storing circuit can store only one bad section address, N=1.

When the number of bad sections stored in the bad section storing circuit 275 reaches N (Y in the operation S305), the bad section storing circuit 275 may activate a full signal FULL, and the error check operation control circuit 271 may stop the error check operation in response to the full signal FULL in operation S309. The error check operation may be an operation for collecting information on the bad sections. When the bad section storing circuit 275 is full and it is no longer possible to store information on the bad sections, there is no need to perform the error check operation. Therefore, the error check operation may stop.

The memory controller 110 may request the memory 120 for bad section information in operation S311. When the memory controller 110 requests the memory 120 for bad section information based on a command and an address CA, the command decoder 210 may recognize it and inform the bad section storing circuit 275.

The bad section storing circuit 275 may transfer the stored bad section information to the memory controller 110 through the data transferring and receiving circuit 203 in operation S313. After the bad section information is transferred to the memory controller 110, the bad section storing circuit 275 may clear the bad section information stored therein. That is, the bad section storing circuit 275 may be initialized or reset. Further, the full signal FULL may be deactivated.

After the bad section information is transferred to the memory controller 110, it may be possible to store new bad section information, that is, the bad section address, in the bad section storing circuit 275. Thus, the error check operation may be resumed. That is, the addresses R_ADD_E and C_ADD_E for an error check operation may be changed in operation S307, and the error check operation may be performed again in the operation S303.

Whether an error check operation is being performed or an error check operation is stopped, when the memory controller 110 commands to stop the error check operation mode, the error check operation mode of the memory 120 may be terminated, and the error check operation may be terminated.

Referring to FIG. 3, when the bad section storing circuit 275 is full during an error checking operation, it is impossible to collect new bad section information. Therefore, unnecessary error checking operation may be stopped. Also, when the bad section storing circuit 275 is emptied, an error check operation may be performed again, and the collection of the bad section information may be resumed.

According to the embodiment of the present invention, an error may be checked in a memory and a memory system.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A method for operating a memory, the method comprising:
   performing an error check operation;
   detecting N bad sections during the error check operation, where N is an integer equal to or greater than 1;
   storing bad section memory address information on the N bad sections in a bad sector storing circuit;
   stopping the error check operation in response to a number of the N bad sections in the bad sector storing circuit reaching a threshold;
   requesting by a memory controller the bad section memory address information on the N bad sections from the bad sector storing circuit;
   transferring the bad section memory address information on the N bad sections to the memory controller in response to the requesting by the memory controller; and
   resuming the stopped error check operation in response to the transferring of the bad section memory address information on the N bad sections to the memory controller.

2. The method of claim 1, wherein the performing of the error check operation includes:
   reading data and an error correction code from selected memory cells of a memory core; and
   detecting an error in the data based on the error correction code.

3. The method of claim 2, wherein the performing of the error check operation further includes:
   correcting the detected error based on the error correction code to produce error-corrected data; and
   writing the error-corrected data into the selected memory cells of the memory core.

4. The method of claim 3, wherein the error check operation is repeatedly performed by changing the selected memory cells of the memory core.

5. The method of claim 1, wherein the detecting of the N bad sections includes:
   detecting a particular area as the bad section when a number of errors detected in the particular area during the error check operation is equal to or greater than a threshold value; and
   checking whether a number of the detected bad sections is N or not.

6. A method for operating a memory system including a memory and a memory controller for controlling an operation of the memory, the method comprising:
   controlling, by a memory controller, the memory to enter an error check operation mode;
   performing, by an error check operation control circuit in the memory, an error check operation in the memory;
   detecting, by a bad section detecting circuit in the memory, N bad sections during the error check operation in the memory, where N is an integer equal to or greater than 1;
   storing, by a bad section storing circuit in the memory, bad section memory address information on the N bad sections in the bad section storing circuit;
   stopping, by the error check operation control circuit, the error check operation when the bad section storing circuit is full;
   requesting, by the memory controller, the bad section memory address information for the N bad sections from the bad sector storing circuit;
   transferring, by a transferring and receiving circuit in the memory, the bad section memory address information for the N bad sections to the memory controller; and
   resuming, by the error check operation control circuit, the stopped error check operation in response to the transferring of the bad section memory address information for the N bad sections.

7. The method of claim 6, wherein the performing of the error check operation includes:
   reading data and an error correction code from selected memory cells of a memory core in the memory; and
   detecting an error in the data based on the error correction code.

8. The method of claim 7, wherein the performing of the error check operation further includes:
   correcting the detected error based on the error correction code to produce error-corrected data; and
   writing the error-corrected data into the selected memory cells of the memory core.

9. The method of claim 8, wherein the error check operation is repeatedly performed by changing the selected memory cells of the memory core.

10. The method of claim 7, wherein the detecting of the N bad sections includes:
    detecting a particular area as the bad section when a number of errors detected in the particular area during the error check operation is equal to or greater than a threshold value; and
    checking whether a number of the detected bad sections is N or not.

11. A memory comprising:
    a memory core including a plurality of memory cells;

an error correction circuit suitable for correcting an error of data read from the memory core based on an error correction code read from the memory core;
an error check operation control circuit suitable for checking an error in data stored in the memory core by using the error correction circuit during an error check operation;
a bad section detecting circuit suitable for detecting a bad section based on the checked error; and
a bad section storing circuit suitable for storing a bad section memory address of the bad section detected by the bad section detecting circuit,
wherein the error check operation control circuit is further suitable for stopping the error checking operation when a number of bad section memory addresses stored in the bad section storing circuit during the error checking operation is N, where N is an integer equal to or greater than 1,
wherein the memory is further suitable for transferring a bad section memory address stored in the bad section storing circuit to a memory controller in response to a request for bad section memory address information from the memory controller, and
wherein the error check operation control circuit is further suitable for resuming the stopped error check operation in response to the transfer of the bad section memory address to the memory controller.

12. The memory of claim 11, wherein after the bad section memory address stored in the bad section storing circuit is transferred to the memory controller, the bad section storing circuit is reset.

13. The memory of claim 11, wherein the error check operation control circuit is further suitable for controlling, during the error check operation, the error correction circuit to write the data of the corrected error into the memory core.

14. The memory of claim 11, wherein N represents a maximum storage capacity of the bad section storing circuit.

15. A memory comprising:
a memory core including sections; and
a control circuit configured to:
perform an error detecting operation on the sections to detect one or more bad memory sections among the sections,
suspend the error detecting operation upon detecting a predetermined number of the bad memory sections, and
resume the suspended error detecting operation upon providing an external device with information of the detected bad memory sections,
wherein at least a predetermined number of errors are detected, through the error detecting operation, from data stored in the bad memory section,
wherein the control circuit transfers bad section memory address information on the one or more bad memory sections to a memory controller in response to a request for the bad section memory address information on one or more bad memory sections from the memory controller,
wherein the control circuit is further configured to resume the suspended error detection operation in response to the transfer of the bad section memory address information to the memory controller.

* * * * *